United States Patent [19]
Cahill

[11] Patent Number: 5,261,119
[45] Date of Patent: Nov. 9, 1993

[54] SIGNAL LEVEL MEASURING SYSTEM FOR A RADIO RECEIVER

[75] Inventor: Stephen V. Cahill, Palatine, Ill.

[73] Assignee: Motorola, Inc., Schaumburg, Ill.

[21] Appl. No.: 719,213

[22] Filed: Jun. 21, 1991

[51] Int. Cl.$^5$ .................... H04B 17/00; H04M 11/00
[52] U.S. Cl. .................. 455/226.1; 455/234.1;
455/33.1; 324/76.19; 379/60
[58] Field of Search ............... 455/33, 115, 226, 234, 455/67; 379/60; 330/2; 324/77 B, 77 C

[56] References Cited

U.S. PATENT DOCUMENTS

| | | | |
|---|---|---|---|
| 4,186,351 | 1/1980 | Brefini et al. | 455/226 |
| 4,939,788 | 7/1990 | Masegawa | 455/234 |

Primary Examiner—Curtis Kuntz
Assistant Examiner—Christine R. Belzer
Attorney, Agent, or Firm—Robert H. Kelly

[57] ABSTRACT

A system, and associated method, for measuring a signal level of a signal received by a receiver, such as a radio telephone. The signal received by the receiver is applied to a variable amplifier. The amplification of the variable amplifier is adjusted such that an amplified signal generated therefrom is within the dynamic range of an intermediate frequency circuit. The level of amplification required to position the signal level of the amplified signal within the dynamic range of the intermediate frequency circuit is measured, and the signal level of the signal received by a receiver is calculated.

27 Claims, 4 Drawing Sheets

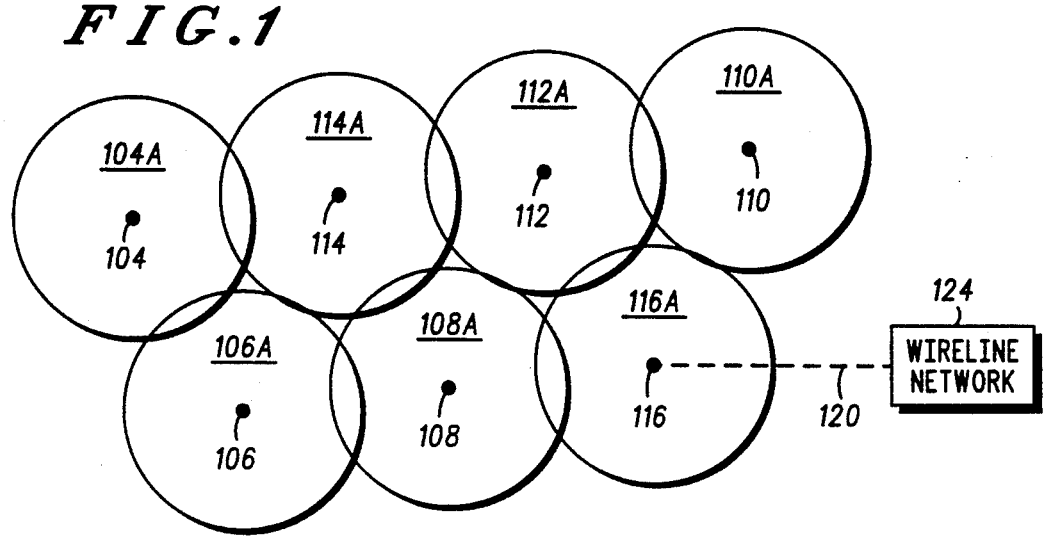
FIG.1
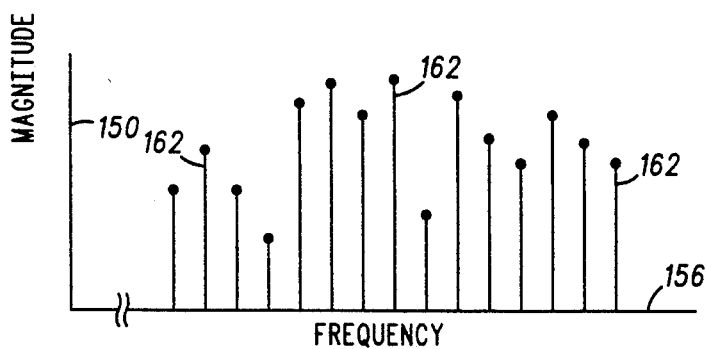
FIG.2
FIG.3A
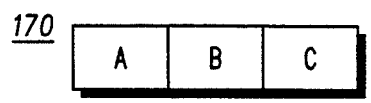
FIG.3B
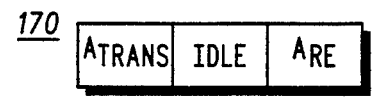
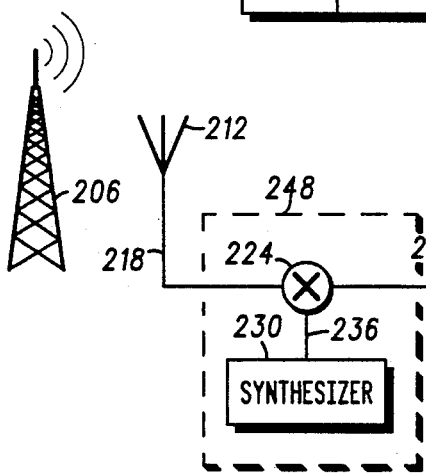
FIG.4

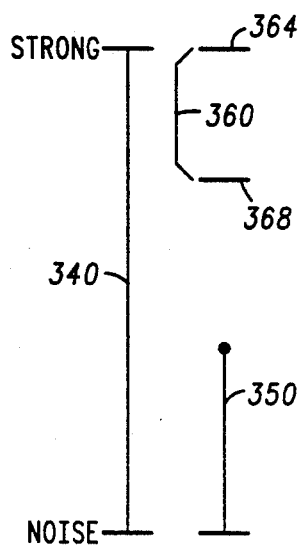
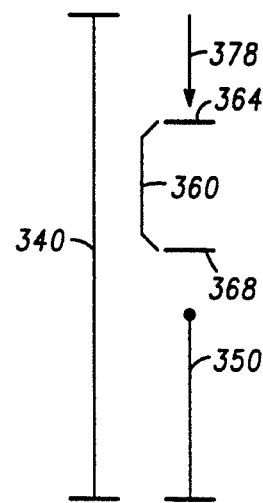
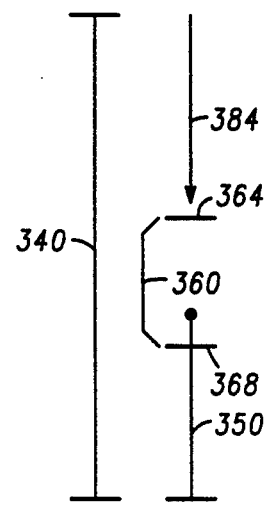
FIG.5A  FIG.5B  FIG.5C
FIG.7
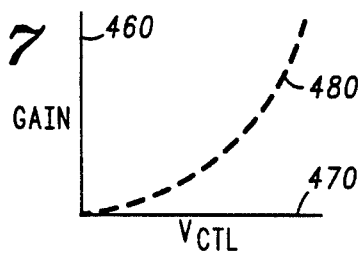
FIG.6
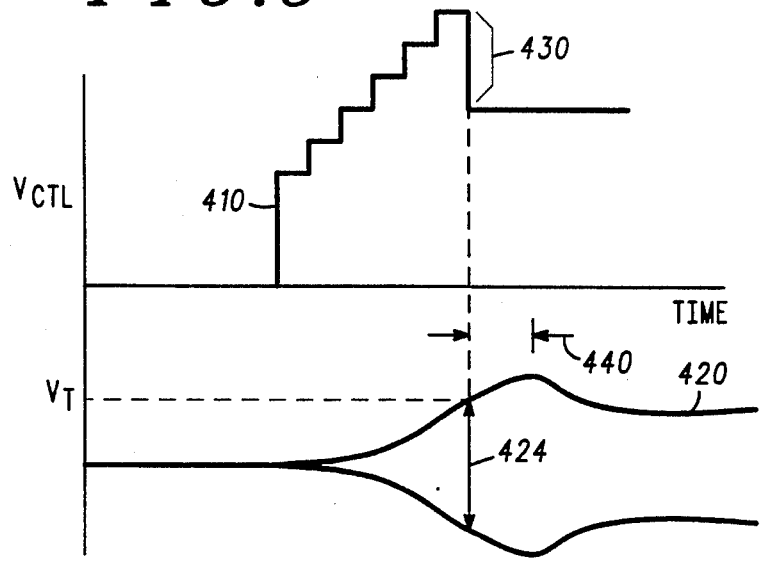

SIGNAL LEVEL MEASURING SYSTEM FOR A RADIO RECEIVER

BACKGROUND OF THE INVENTION

The present invention relates generally to radio receiver circuitry, and, more particularly, to a system, and associated method therefor, for measuring a signal level of a signal received by a receiver.

In a cellular, communication system, numerous fixed-site transceivers, referred to as "base stations" are installed at spaced-apart locations throughout a geographical area. Each of the base stations contains circuitry to receive modulated signals transmitted thereto, and to transmit modulated signals therefrom. A radio telephone transmits the modulated signals to a base station, and a base station transmits the modulated signals to the radio telephone. Two-way communication is thereby effectuated between a base station and a radio telephone.

A plurality of radio telephones may communicate simultaneously with a single base station when the modulated signals generated by each of the different radio telephones are of dissimilar frequencies. (The signals transmitted by a base station to each of the plurality of radio telephones are also of dissimilar frequencies).

Because a cellular, communication system is formed of a plurality of base stations positioned at spaced-apart locations, continuous communication between a radio telephone and at least one of the base stations defining the cellular, communication system is permitted as long as at least one base station is within the transmission range of the radio telephone. As a radio telephone, such as a mobile phone, may be moved during operation thereof, the radio telephone may first be positioned such that a first base station is within the transmission range of the radio telephone, and then moved such that a second base station is within the transmission range thereof. Responsive to such movement, the base station to which the radio telephone transmits the modulated signal, and the base station from which the radio telephone receives a modulated signal, changes. The process by which this change occurs is referred to as a process of "handing-off". This process of handing-off occurs automatically, without any action taken on the part of a user of the radio telephone.

To determine when a "hand-off" occurs, measurement of the signal levels of signals transmitted by a base station is taken. Responsive to such measurements, the radio telephone transmits information indicative of the signal levels of the signals transmitted thereto, and a base station determines when the "hand-off" should occur. Therefore, accurate measurement of the signal levels of signals received by a radio telephone is essential to ensure optimal operation of a cellular, communication system.

With the increasing popularity of cellular communications, existing cellular, communication systems are, at times, approaching full capacity. Viz., at some times, additional users of a cellular, communication system can not obtain access to the system to communicate thereupon until other users first discontinue communications thereupon. Such occasions most frequently occur during morning and evening rush periods during which the greatest number of users typically desire to make use of the cellular, communication system.

As the range of frequencies permitted of cellular communications is limited, schemes have been developed to utilize more efficiently the available frequencies upon which cellular communication is permitted. For instance, a time division multiplexing technique (and, more particularly, a time division multiple access or TDMA technique) has been adopted in the United States as one means by which the capacity of a cellular, communication system may be increased.

In such a multiplexing technique, a single frequency channel (upon which only one radio telephone transmits or receives a modulated signal in a conventional system) may be shared by more than one radio telephone to permit concurrent use of the same frequency channel. In such a technique, two or more radio telephones transmit sequentially, and in short bursts, modulated signals upon the single frequency channel. Preliminary systems have, in fact, been developed in which a single frequency channel may be shared by three radio telephones to transmit signals concurrently thereupon. In such preliminary systems, a time period is divided into three portions wherein a single radio telephone transmits in one of the three portions, receives information in a second of the three portions, and, during a third of the three portions, the radio telephone may perform other functions. If the signal levels of the signals transmitted thereto by the various base stations could be measured during this third portion of the time period, optimal decisions as to when a "hand-off" should occur between base stations could be made.

However, as each time period is quite short in duration (on the order of thirteen milliseconds in duration), the portion of the time period during which the radio telephone has available to measure the signal levels of the signals transmitted thereto is even more limited.

As determination of the signal levels of signals generated by base stations on data channels requires tuning of the radio telephone to another frequency to such data channels and returning to the first frequency channel to receive a signal during a subsequent time period, only a fraction of the portion of a time period is available to measure the signal levels of signals transmitted to the radio telephone.

The dynamic range of circuitry of the radio telephone is typically limited due to the construction of the circuitry (namely, the circuitry is typically disposed upon integrated circuits, and integrated circuits inherently are of limited dynamic ranges). Therefore, the dynamic range of the circuitry must be adjusted to properly measure the signal levels of signals received by the radio telephone. Such adjustment additionally requires time.

Because of the small amount of time permitted to make a determination of the signal level of the signals transmitted to the radio telephone, existing methods of determining the signal levels of the signals transmitted to the radio telephone are inadequate.

What is needed, therefore, is an improved system for measuring a signal level of a signal received by a receiver.

SUMMARY OF THE INVENTION

The present invention, therefore, advantageously provides an improved system for measuring a signal level of a signal received by a receiver.

The present invention further advantageously provides a method for measuring a signal level of a signal received by a receiver.

The present invention provides further advantages and features, details of which will become more apparent by reading the detailed description of the preferred embodiments hereinbelow.

In accordance with the present invention, therefore, a system for measuring a signal level of a signal received by a receiver is disclosed. Amplification circuitry having an adjustable gain coefficient amplifies the signal received by the receiver to form thereby an amplified signal having a signal level of a value dependant upon a coefficient value of the gain coefficient. Signal modification circuitry having a dynamic range receives the amplified signal generated by the amplification circuitry, and generates a modified signal when the amplified signal is of a signal level within the dynamic range of the signal modification circuitry. The gain coefficient of the amplification circuitry is incrementally increased when the signal level of the amplified signal is beyond the dynamic range of the modification circuitry or when the signal level of the modified signal generated by the modification circuitry is of a value less than a predetermined level. The gain coefficient of the amplification circuitry is decreased once the signal level of the modified signal generated by the modification circuitry is at least as great as the predetermined level. The signal level of the signal received by the receiver is calculated responsive to measurement of the signal level of the modified signal and of the coefficient value of the gain coefficient of the amplification circuitry.

BRIEF DESCRIPTION OF THE DRAWINGS

The present invention will be better understood when read in light of the accompanying drawings in which:

FIG. 1 is a schematic view of a portion of a cellular communication system;

FIG. 2 is a graphical representation of a plurality of signals simultaneously transmitted upon a plurality of frequency channels;

FIG. 3A represents graphically a single time period of a time division multiplexing system in which three radio telephones transmit modulated signals during portions of the time period;

FIG. 3B represents graphically operation of a single radio telephone during the three portions of the time period represented in FIG. 3A;

FIG. 4 is a simplified block diagram of the system for measuring a signal level of a signal received by a receiver according to a preferred embodiment of the present invention;

FIG. 5A is a graphical representation illustrating the relationship between the dynamic range of the circuitry of the preferred embodiment of FIG. 3 and a signal transmitted to the radio telephone upon a frequency channel;

FIG. 5B is a graphical representation, similar to that of FIG. 5A, also illustrating the relationship between the dynamic range of the circuitry of FIG. 3 and the signal transmitted to the radio telephone during operation of the system of the preferred embodiment of the present invention;

FIG. 5C is a graphical representation, similar to those of FIGS. 5A and 5B, but illustrating the relationship between the dynamic range of the circuitry of FIG. 3 and the signal transmitted to the radio telephone upon the frequency channel when the signal level of the signal is within the dynamic range of the circuitry;

FIG. 6 are graphical representations illustrating the relationship between signals generated by portions of the circuitry of the simplified block diagram of FIG. 3 during operation of the system of the present invention;

FIG. 7 is a graphical representation representing the relationship between the gain of the variable amplifier forming a portion of the circuitry of FIG. 3 and a control voltage applied thereto;

DESCRIPTION OF THE PREFERRED EMBODIMENTS

Figure 8:
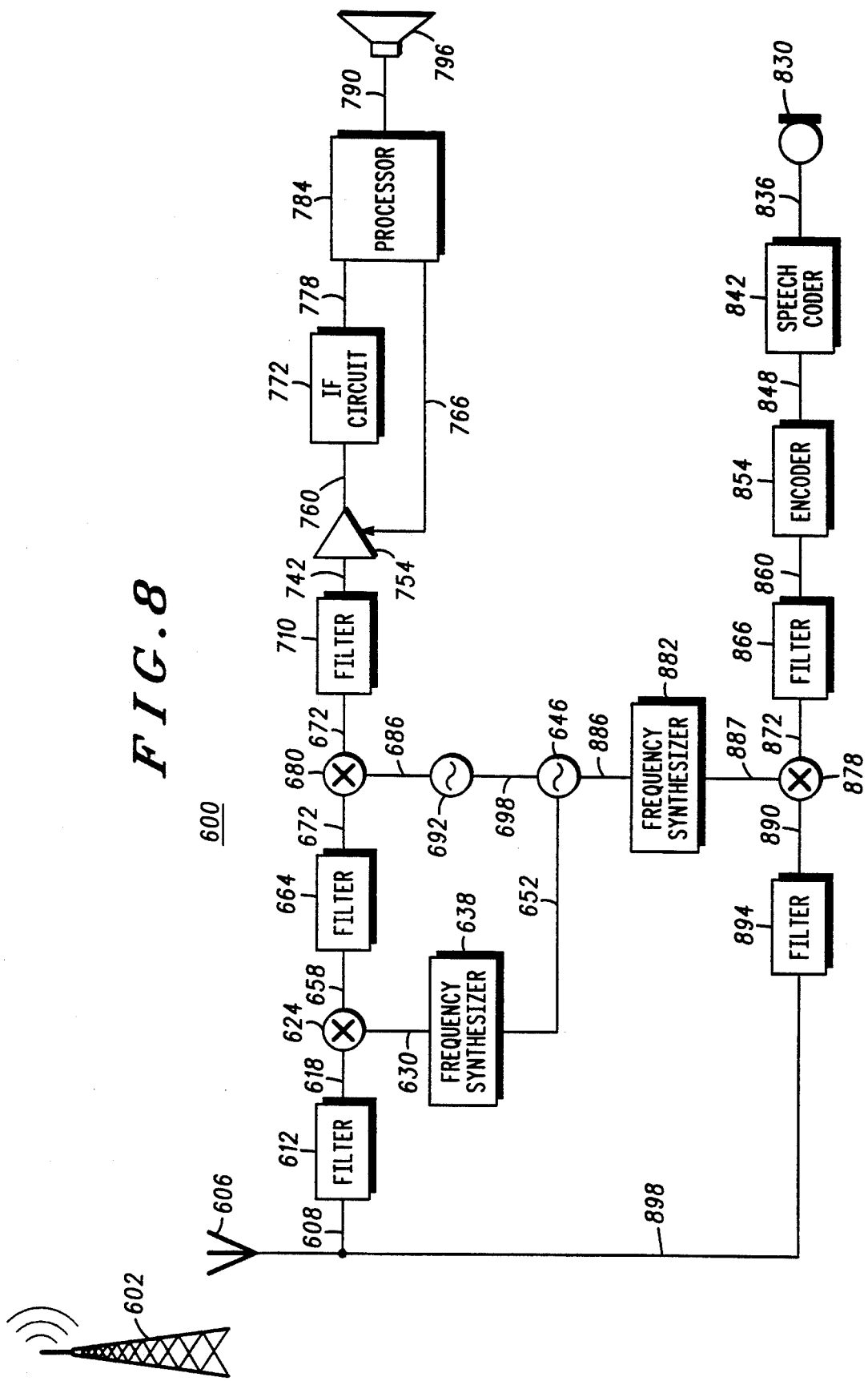
FIG. 8 is a block diagram of a radio telephone incorporating the system of FIG. 3 therein.

Referring first to FIG. 1, a cellular, communication system is graphically shown. A cellular, communication system is formed by the positioning of numerous base stations at spaced-apart locations throughout a geographical area. A base station, as described hereinabove, contains circuitry both for transmitting a modulated signal therefrom and for receiving a modulated signal transmitted thereto. The base stations are indicated in FIG. 1 by points 104, 106, 108, 110, 112, 114, and 116. While FIG. 1 illustrates six separate base stations indicated by points 104-116, it is to be understood, of course, that an actual, cellular, communication system is conventionally comprised a large plurality of base stations. Each of the base stations 104-116 is coupled to a conventional, wireline, telephonic network. Such connection is represented in the Figure by line 120, shown in hatch, interconnecting base station 116 and wireline network 124. Connections between wireline network 124 and other ones of the base stations 104-114, although not illustrated, may be similarly shown.

The positioning of each of the base stations 104-116 forming the cellular, communication system is carefully selected to ensure that at least one base station is positioned to receive a modulated signal transmitted by a radio telephone positioned at any location throughout the geographical area which is to be encompassed by the cellular system.

As the power levels at which a radio telephone is capable of operating are typically significantly less than the power levels at which a fixed-site base station may operate, the maximum transmission range of a signal generated by a radio telephone is correspondingly less than the maximum transmission range of a signal generated by a base station. Therefore, the maximum transmission range of a radio telephone is a primary factor which must be considered when determining the locations at which the base stations are positioned throughout a geographical area.

Because of the spaced-apart nature of the positioning of the base stations, portions of the geographical area throughout which the base stations 104-116 are located are considered to be associated with individual ones of the base stations. Portions of the geographical area proximate to each of the spaced-apart base stations 104-116 define "cells" which are represented in the Figure by areas 104A, 106A, 108A, 110A, 112A, 114A, and 116A surrounding respective ones of the base stations 104-116. A cell defined thereby is of a size such that a base station associated therewith is within the transmission range of a radio telephone when positioned in the cell. Cells 104A-116A together define the geographical area encompassed by the cellular, communication system. Because of the overlapping nature of the cells, a radio telephone positioned within the boundaries of any of the cells of the cellular, communication system may transmit, and receive, modulated signals to, and from at least one base station 104-116.

Because a radio telephone is not fixed in position, but, rather, may be moved during operation thereof, the radio telephone may first be positioned such that a first base station is within the transmission range of the radio telephone, and then moved such that a second base station is within the transmission range thereof.

For instance, with respect to FIG. 1, a mobile telephone positioned in an automotive vehicle may be initially located such that only base station 116 is within the reception range of the mobile telephone. As the automotive vehicle is operated, the mobile telephone may later be positioned such that only base station 112 is within the reception range of the mobile telephone.

The process by which the radio telephone terminates transmission of modulated signals to a first of the base stations, and initiates transmission of the modulated signals to a second of the base stations is referred to as "handing-off". A "hand-off" between base stations occurs responsive to measurement of signal levels of signals transmitted by the base stations. A hand-off typically occurs when the signal level of a signal transmitted by a second of the base stations exceeds in magnitude the signal level of a signal transmitted by a first of the base stations. With respect to the above example, when the automotive vehicle in which the mobile telephone is positioned passes from cell 116A to cell 112A, the signal level of signals generated by base station 112, when received by the mobile telephone, become greater in magnitude than the signals generated by base station 116, when received by the mobile telephone. To permit continuous, uninterrupted transmission of signals generated by the mobile telephone, a hand-off must occur between base station 116 and base station 112. Accurate measurement of the signal levels of signals transmitted to the radio telephone is therefore essential to ensure optimal operation of a cellular, communication system.

Turning now to the graphical representation of FIG. 2, a plurality of simultaneously-transmitted, modulated signals are plotted as a function of frequency. Magnitudes of the modulated signals are scaled in terms of, for example, watts, decibels (dB), or decibels per milliwatt (dBm) on ordinate axis 150 as a function of frequency scaled in terms of hertz on abscissa axis 156. The modulated signals are indicated by single-frequency spikes 162 located at different frequencies. While the modulated signals are indicated by spikes 162, it is to be understood that each modulated signal is actually comprised of a bandwidth of frequencies forming a modulation spectrum. The frequency channels upon which the modulated signals are transmitted are separated in frequency such that signals transmitted upon adjacent ones of the frequency channels do not overlap. As only a limited portion of a frequency band is allocated for radio telephone communications, only a finite number of frequency channels may be defined upon the allocated portion of the frequency band, and only a finite number of radio telephones may be operated at any time in a cellular, communication system.

As usage of cellular, communication systems increases, the capacity of existing cellular systems to accommodate additional numbers of users is limited. Therefore, schemes have been developed to increase the capacity of the existing cellular, communication systems. As mentioned hereinabove, one such scheme increases the capacity of an existing cellular, communication system by the use of time division multiplexing (i.e., time division multiple access, TDMA) which permits more than one radio telephone to transmit signals concurrently upon a single frequency channel.

FIG. 3A illustrates a single time period, referred to generally by reference numeral 170, defined in a TDMA system in which three radio telephones may concurrently transmit upon a single frequency channel. Time period 170 is divided into three equal portions. The portions of time period 170 are identified by letters A, B, and C to indicate that a first radio telephone, radio telephone A, transmits during a first portion of time period 170, that a second radio telephone, radiotelephone B, transmits during a second portion of time period 170, and that a third radio telephone, radio telephone C, transmits during a third portion of time period 170. It is to be noted that other time periods may similarly be defined in other TDMA systems to be comprised of other numbers of portions. Time period 170 is representative of the time periods defined by the United States Digital Cellular System.

FIG. 3B illustrates operation of a single radio telephone, here radio telephone A, during time period 170. As described with respect to FIG. 3A, radio telephone A transmits only during a single portion of the time period, and does not transmit a modulated signal during the remainder of the time period. Therefore, radio telephone A transmits only during one third of time period 170. During a second portion of time period 170, FIG. 3B illustrates operation of radio telephone A to receive a modulated signal transmitted by a base station thereto. During a third portion of time period 170, referred to as the IDLE period, radio telephone A is not operative to transmit or to receive modulated signals, but is operative to perform other functions. It is during this third portion of time period 170 that radio telephone A can be tuned "off-frequency" (i.e., tuned to receive signals generated on other frequency channels, such as data signals generated by base stations on various data channels) to measure the signal levels of signals transmitted upon other channels. As the radio telephone must both tune off frequency, tune back on frequency (i.e., return to the original frequency channel) and also measure the signal levels of the signals transmitted on the "off frequency" channels during the IDLE period (which, again is approximately four milliseconds in length), means are required to quickly measure the signal levels of the signals upon these other channels during the IDLE period.

Turning now to FIG. 4, the system of the present invention, referred to generally by reference numeral 200, is shown in simplified block form. System 200 is operative to quickly and accurately measure the signal level of a signal transmitted thereto. Because of the speed at which system 200 is able to determine accurately a signal level of a signal transmitted thereto, a determination of the signal level may be obtained during the IDLE portion of time period 170 of FIGS. 3A-3B.

A signal transmitted by a base station, indicated in FIG. 4 by tower 206 is received by antenna 212. Antenna 212 generates a signal indicative of the signal received thereat on line 218 which is supplied as an input to mixer 224. A signal generated by frequency synthesizer 230 on line 236 is additionally supplied as an input to mixer 224. (The signal generated by frequency synthesizer 230 may be altered in frequency to select thereby the frequency channel at which a receiver is operative.) Mixer 224 mixes the signal supplied thereto on lines 218 and 236, and generates a mixed signal on line 242. Mixer 224 and frequency synthesizer 230 is illustrated to indicate down-mixing in frequency of the signal received by antenna 212. It is to be understood, of course, that the down-mixing in frequency performed by mixer 224 and frequency synthesizer 230 typically forms a portion of more elaborate circuitry forming receiver down-conversion circuitry, indicated in the Figure by block 248, shown in hatch. Appropriate circuitry, well known per se in the art, may be utilized to form appropriate circuitry to generate a signal of a desired frequency on line 242.

Line 242 is coupled to an input of variable amplifier 254. Amplifier 254 generates an amplified signal on line 260 which is of a level, relative to the level of the signal supplied to the amplifier on line 260, which is dependent upon the coefficient value of the gain coefficient of amplifier 254. The gain coefficient of amplifier 254 is controlled by a control voltage forming a voltage signal generated on line 266 which is applied to control terminals of amplifier 254.

Line 260 is coupled to intermediate frequency circuit 272 which is operative to down-convert further the signal supplied thereto on line 260, and to generate a down-converted signal on line 278 (referred to as a baseband signal). Typically, intermediate frequency circuit 272 is disposed upon an integrated circuit. As mentioned previously, the dynamic range of active components forming the integrated circuit is limited. Therefore, the signal supplied to circuit 272 on line 260 must be within the dynamic range of circuit 272 for circuit 272 to generate a signal of a signal level which is accurate and representative of a signal applied thereto. When a signal generated on line 260 is beyond the dynamic range of circuit 272, the signal generated on line 278 is erroneous and is either "clipped" or of a predetermined magnitude.

Line 278 is coupled to signal processor 284 which processes the signal supplied thereto on line 278 and generates a signal indicative thereof on line 290. Additionally, signal processor 284 generates a signal forming the control voltage on line 266 which is operative to control the coefficient value of the gain coefficient of variable amplifier 254.

Operation of the circuit forming system 200 may perhaps best be described in connection with the graphical representations of FIGS. 5A-5C. With respect, then, to FIG. 5A, the vertically-extending line which forms axis 340 represents the possible signal levels of a signal received by antenna 212 of system 200. The range of values of signal levels of signals received by antenna 212 extend between a noise level (a signal must be of a level greater than the energy level of background noise) and a strong signal which is of a signal level requiring no amplification (or even attenuation) by amplifier 254.

Signal spike 350 is representative of a signal transmitted by a transmitter upon a frequency channel, received by antenna 212 of the circuit of system 200, and generated on line 260. Spike 350, while indicative of a single frequency, is actually representative of a modulated signal having a modulation spectrum, analogous to lines 162 of FIG. 2. Spike 350 is of a signal level having a value greater than the energy level of background noise. A range of energy levels indicated by bracket 360 defining an upper bound level, indicated by line 364, and a lower bound level, indicated by line 368, represents the dynamic range of intermediate frequency circuit 272. A signal supplied to circuit 272 on line 260 must be within the dynamic range thereof for a signal indicative of the true value of the signal level thereof to be generated on line 278. As the signal level of signal 350 is of a value less than the value defining the lower bound level of the dynamic range, indicated by line 368, a signal supplied to circuit 272 on line 260 of a signal level corresponding to the signal level of line 350 is not accurately reproduced on line 278.

FIG. 5B is similar to that of FIG. 5A and includes similarly numbered axis 340, spike 350 representative of a signal received by antenna 212 of the circuit of the system 200, and bracket 360 representing the dynamic range of intermediate frequency circuit 272. The dynamic range is bounded by an upper bound level, indicated by line 364, and lower bound level, indicated by line 368. FIG. 5B differs from that of FIG. 5A in that the values defining the upper bound level and the lower bound level, indicated by lines 364 and 368, respectively, are of different values. The dynamic range, represented by bracket 360, however, is of the same magnitude. The upper and lower bound levels defining the dynamic range of circuit 272 are altered by altering the coefficient value of the gain coefficient of variable amplifier 254.

FIG. 5A is representative of no amplification by amplifier 254; FIG. 5B, conversely, represents incremental increase of the amplification of amplifier 254 (i.e., the coefficient value of the gain coefficient of amplifier 254 is greater than one). Such increase in the amplification of amplifier 254 is indicated by arrow 378. FIG. 5B, similar to FIG. 5A, again represents a signal received by antenna 212 of the circuitry of system 200 which is not within the dynamic range of circuit 272.

The representation of FIG. 5C is similar to those of FIGS. 5A-5B, and includes similarly-number axis 340, line 350 representative of a signal received by antenna 212 of the circuitry of system 200, bracket 360 representative of the dynamic range of circuit 272 which defines upper and lower bound levels indicated by line 364 and 368. The coefficient value of the gain coefficient of amplifier 254 is further incrementally increased relative to the level of amplification of amplifier 254 shown in FIG. 5B; such increased amplification is indicated by arrow 384. Responsive to such increased amplification, the values defining upper and lower bound levels indicated by lines 364 and 368, respectively, are correspondingly altered.

FIG. 5C represents amplification of levels such that the signal level of the signal received by antenna 212 of the circuitry of system 200 is within the dynamic range of circuit 272. Such is indicated by bracket 390. As the signal level of the signal indicated by line 350 is greater than the level defined by the lower bound of the dynamic range, an accurate determination of the signal level may be calculated responsive to measurement of the magnitude of the signal within the dynamic range (such level being indicated in FIG. 5C by bracket 390) and the determination of the level of amplification of amplifier 254 (indicated by the figure by arrow 384). An appropriate algorithm embodied in signal processor 284 permits calculation of the signal level of the signal applied to antenna 212 when the signal level is within the dynamic range of circuit 272, as illustrated in FIG. 5C.

The graphical representation of FIG. 6 indicates graphically the relationship between the control voltage applied to amplifier 254 on line 266 and the signal generated by circuit 272 on line 278. More particularly, the top portion of the graphical representation of FIG. 6 plots the magnitude of the level of the control voltage, $V_{ctl}$, as a function of time, to form plot 410. The control voltage, $V_{ctl}$, represents the voltage of the signal applied on line 266 to amplifier 254.

The bottom portion of FIG. 6 is a plot of the energy level (i.e., the signal level of the signal generated by circuit 272 on line 278, as a function of time, to form plot 420).

Examination of plot 410 indicates an incremental increase of the control voltage to form thereby a step function having a stepped increase of a predetermined rate and of a predetermined magnitude of increase. More particularly, signal processor 284 generates a voltage signal on line 266 of levels corresponding to plot 410 of FIG. 6 until the magnitude of the signal supplied to the processor 284 on line 278 reaches a predetermined value. Such predetermined value is indicated by arrow 424 of the envelope formed of plot 420, and indicated by threshold voltage level $V_t$.

When this signal generated on line 278 is of a level corresponding to the threshold voltage level $V_t$, the voltage level of the signal generated on line 266 by signal processor 284 decreases by a predetermined amount, indicated in the Figure by bracket 430. Such decrease in the voltage level of the signal generated on line 266, when applied to the control terminals of amplifier 254, causes a reduction in the coefficient value of the gain coefficient, and, hence, a reduction in the amplification of the signal generated on line 260. However, because of an intrinsic delay associated with circuit 272, this reduction in the level of amplification of the signal generated on line 260 does not cause a decrease in the value of the signal generated on line 278 for a time period indicated by arrows 440. Thereafter, the signal level of the signal generated on line 278 is reduced, as indicated by plot 420.

The decrease in the voltage level of the signal generated on line 266, as indicated by bracket 430, permits a most rapid decrease of the signal level of the signal generated on line 278 to minimize thereby the amount of time required to accurately calculate the signal level of the signal received at antenna 212 of the circuitry of the system 200, and as described with respect to FIG. 5C hereinabove.

The intrinsic delay of circuit 272 may be predetermined, or is readily measurable, such that the delay period, as indicated by arrows 440, is of a known value. Additionally, the relationship between the coefficient value of the gain coefficient of amplifier 254 and the level of the control voltage, $V_{ctl}$, may similarly also be predetermined, or be readily measurable.

For instance, the graphical representation of FIG. 7 is a plot of the relationship between the gain of the amplifier and the control voltage, $V_{ctl}$, wherein the value of the gain is plotted on ordinate axis 460 as a function of the control voltage, $V_{ctl}$, on abscissa axis 470. Plot 480 illustrating the relationship therebetween may be stored, for example, in a memory look-up table, or may be mathematically-described such that the association between the gain of amplifier 254 and the level of the control voltage applied to control terminals thereof on line 266 is readily known.

Utilization of these known values may also be utilized to determine the decrease, indicated by bracket 430, of the control voltage, $V_{ctl}$, applied to the control terminal of amplifier 254. Because the decrease of the control voltage is not incremental, as was the increase, a minimal amount of time is required to determine the signal level of the signal received by antenna 212.

Turning now to the block diagram of FIG. 8, a radio telephone, referred to generally by reference numeral 600, constructed according to the present invention and including circuitry of system 200 of FIG. 4, is shown. Radio telephone 600 includes the circuitry of system 200 of FIG. 4. Radio telephone 600 may, for example, comprise a portable or mobile radio telephone utilized in a cellular, communication system. A signal transmitted by a base station, indicated in the figure by tower 602 is received by antenna 606. Antenna 606 generates a signal on line 608 which is coupled to filter 612. Filter 612 filters the received signal, and generates a filtered signal on line 618.

Line 618 is coupled as an input to mixer 624 which also receives an oscillating signal on line 630 formed by frequency synthesizer 638 responsive to the oscillating frequency of reference oscillator 646, the oscillating signal generated thereat being connected to synthesizer 638 by line 652. Mixer 624 converts downward in frequency the signal supplied thereto on line 618, and generates a down-converted signal on line 658 which is supplied to filter 664. Filter 664 generates a filtered signal on line 672 which is supplied to second mixer 680.

Mixer 680 additionally receives an oscillating input signal on line 686 supplied by oscillator 692. The oscillating frequency of oscillator 692 is controlled by the oscillating frequency of reference oscillator 646, and is coupled to oscillator 646 by line 698. Mixer 680 generates a second, down-converted signal on line 704 which is supplied to filter 710. Filter 710 generates a filtered signal on line 742 which is supplied to variable amplifier 754. Amplifier 754 of FIG. 8 corresponds with variable amplifier 254 of FIG. 4. The coefficient value of the gain coefficient, and, hence, the level of amplification of the amplified signal generated thereby on line 760, is controlled by the voltage level of a voltage signal generated on line 766 and applied to the control terminals of amplifier 754. Line 760 is coupled to intermediate frequency circuit 772 which generates a baseband signal on line 778. Line 778 is coupled to signal processor 784. Signal processor 784 performs functions including signal decoding and speech decoding. Signal processor 784 is additionally operative to generate a voltage signal which is supplied on line 766 to the control terminals of amplifier 754. Signal processor additionally generates a signal on 790 which is supplied to speaker 796.

A transmit portion of radio telephone 600 includes a transducer, such as microphone 830, which converts a voice signal into electrical form and generates a signal indicative thereof on line 836. Line 836 is coupled to speech coder 842 which converts the electrical signal supplied thereto into a desired, binary sequence, and generates a signal indicative of such on line 848. Line 848 is coupled to encoder 854 which generates encoded signal on line 860 which is supplied to filter 866. Filter 866 generates a filtered signal on line 872 which is coupled to an input of mixer 878. Mixer 878 is additionally coupled to frequency synthesizer 882 by line 886. Frequency synthesizer 882 is coupled to reference oscillator 646 by way of line 886. Mixer 878 generates a mixed signal on line 890 which is filtered by filter 894. Filter 894 generates a filtered signal on line 898 which is coupled to antenna 606 to permit transmission of an information signal therefrom.

During those portions of a time period, referenced by reference numeral 170 of FIGS. 3A-3B, the receiver portion of radio telephone 600 is operative to tune-off frequency by appropriate adjustment of frequency synthesizer 638 to detect a signal generated by a base station, indicated by tower 602. Signal processor 784 is operative to generate a control voltage which incrementally increases in a manner similar to that described with respect to FIG. 6, until a signal generated by circuit 772 on line 778 increases to a predetermined value. Responsive to detection of such increase, signal processor 784 generates a control signal of a voltage level of reduced magnitude on line 766 to decrease the level of amplification of amplifier 754. Measurement of the signal level of the signal transmitted by base station to antenna 606 of radio telephone 600 may thereafter be calculated. Signal processor 784 may, for instance, include an algorithm operative to calculate the following equation:

$$M_{RS} = \alpha M_{MS}$$

where:

$M_{RS}$ is the magnitude of the received signal received by antenna 606;

$M_{MS}$ is the magnitude of the modified signal generated by circuit 772; and $\alpha$ is the coefficient value of the gain coefficient of amplifier 752, as determined by the voltage level of the control signal applied to control terminals thereof on line 266.

Figure 9:
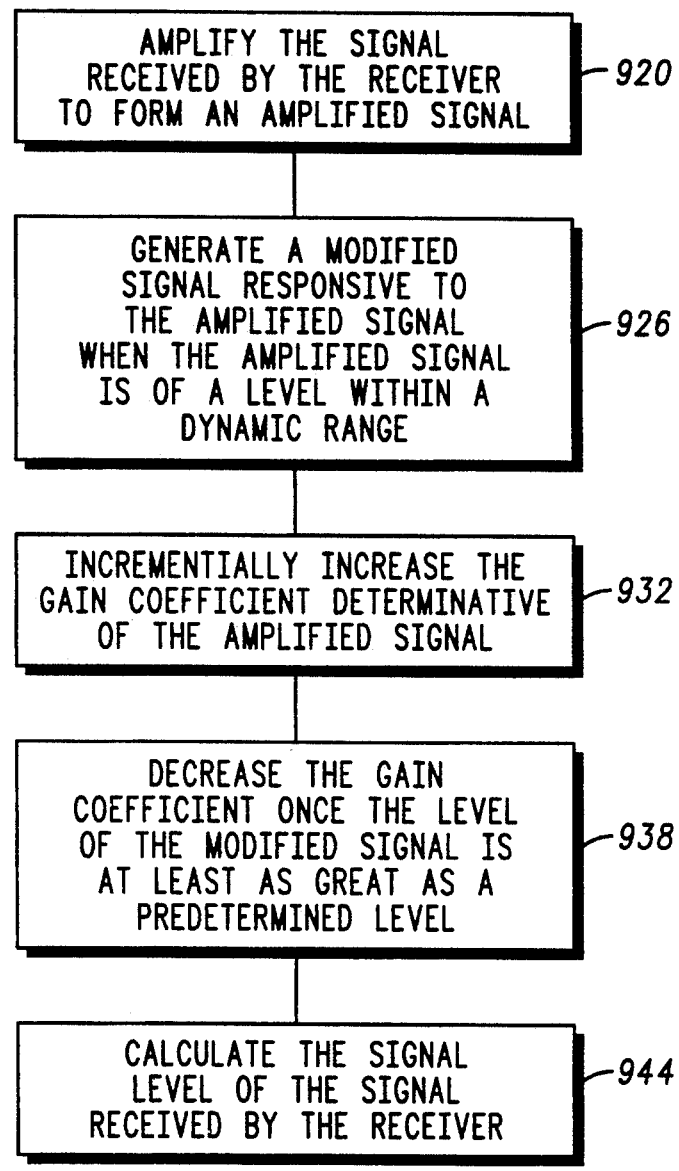
FIG. 9 is a flow diagram listing the methods steps of the method of the preferred embodiment of the present invention.

Finally turning now to the flow diagram of FIG. 9, the method steps of the method of a preferred embodiment of the present invention are listed. First, and as indicated by block 920, the signal received by a receiver is amplified to form thereby an amplified signal having a signal level of a value dependent upon a coefficient value of a gain coefficient. Next, and as indicated by block 926, a modified signal is generated responsive to the amplified signal when the amplified signal is of a signal level within a dynamic range. Next, and as indicated by block 932, the gain coefficient determinative of the value of the amplified signal is incrementally increased when the amplified signal is of a signal level beyond the dynamic range, or when the signal level of the modified signal is of a value less than a predetermined level. Next, and as indicated by block 938, the gain coefficient is decreased once the signal level of the modified signal is at least as great as the predetermined level. Finally, and as indicated by block 944, the signal level of the signal received by the receiver is calculated responsive to measurement of the signal level of the modified signal and of the coefficient value of the gain coefficient.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A system for measuring a signal level of a signal received by a receiver, said system comprising:

means forming amplification circuitry having an adjustable gain coefficient for amplifying the signal received by the receiver to form thereby an amplified signal having a signal level of a value dependent upon a coefficient value of the gain coefficient;

means forming signal modification circuitry having a dynamic range for receiving the amplified signal generated by the amplification circuitry and for generating a modified signal when the amplified signal is of a signal level within the dynamic range of the signal modification circuitry;

means for incrementally increasing the gain coefficient of the amplification circuitry when the signal level of the amplified signal is beyond the dynamic range of the modification circuitry or when the signal level of the modified signal generated by the modification circuitry is of a value less than a predetermined level;

means for decreasing the gain coefficient of the amplification circuitry once the signal level of the modified signal generated by the modification circuitry is at least as great as the predetermined level; and means for calculating the signal level of the signal received by the receiver responsive to measurement of the signal level of the modified signal and of the coefficient value of the gain coefficient of the amplification circuitry.

2. The system of claim 1 wherein the modification circuitry formed of said means for receiving comprises intermediate frequency demodulation circuitry.

3. The system of claim 2 wherein said intermediate frequency demodulation circuitry is disposed upon an integrated circuit.

4. The system of claim 1 wherein values defining the dynamic range of the signal modification circuitry vary responsive to the coefficient value of the gain coefficient.

5. The system of claim 1 wherein said modification circuitry has associated therewith an intrinsic delay such that the modified signal generated by the modification circuitry responsive to application of the amplified signal thereto is delayed by a time period corresponding to the length of the intrinsic delay associated with the modification circuitry.

6. The system of claim 1 wherein said means for amplifying comprises at least one variable amplifier.

7. The system of claim 6 wherein the coefficient value of the adjustable gain coefficient is adjusted by varying a control voltage applied to control terminals of the variable amplifier.

8. The system of claim 7 wherein said means for incrementally increasing the gain coefficient of the amplification circuitry comprises means for incrementally increasing the control voltage applied to the control terminals of the variable amplifier.

9. The system of claim 8 wherein said means for incrementally increasing the control voltage comprises processor circuitry operative to receive the modified signal generated by the modification circuitry and to generate a voltage signal of levels suitable for application to the control terminals of the variable amplifier.

10. The system of claim 9 wherein said processor circuitry incrementally increases the level of said voltage signal generated thereby at a pre-determined rate and in a predetermined incremental value.

11. The system of claim 9 wherein said processor circuitry embodies an algorithm for measuring the signal level of the modified signal and for determining values of the voltage signal generated thereby.

12. The system of claim 7 wherein said means for decreasing the gain coefficient of the amplification circuitry comprises means for decreasing the control voltage applied to the control terminals of the variable amplifier.

13. The system of claim 12 wherein said means for decreasing the control voltage comprises processor circuitry operative to receive the modified signal generated by the modification circuitry and to generate a voltage signal of levels suitable for application to the control terminals of the variable amplifier.

14. The system of claim 13 wherein said processor circuitry decreases the level of said voltage signal generated thereby when said modified signal is of a value at least as great as the predetermined level.

15. The system of claim 13 wherein said processor circuitry embodies an algorithm for measuring the signal level of the modified signal and for determining values of the voltage signal generated thereby.

16. The system of claim 1 wherein said means for calculating the signal level of the signal received by the receiver comprises processor circuitry having an algorithm embodied therein.

17. The system of claim 16 wherein said means for calculating the signal level calculates a value of the signal level by measuring the signal level of the modified signal which is of a value within the dynamic range of the modification circuitry, and then altering the signal level of the modified signal by a factor corresponding to the coefficient value of the amplification circuitry.

18. The system of claim 17 wherein the algorithm embodied by the processor circuitry is operative to calculate the equation:

$$M_{RS} = \alpha M_{MS}$$

where:
 $M_{RS}$ is the magnitude of the received signal;
 $M_{MS}$ is the magnitude of the modified signal; and
 $\alpha$ is the coefficient value of the gain coefficient of the amplification circuitry.

19. A method for measuring a signal level of a signal received by a receiver, said method comprising the steps of:
 amplifying the signal received by the receiver to form thereby an amplified signal having a signal level of a value dependent upon a coefficient value of a gain coefficient;
 generating a modified signal responsive to the amplified signal when the amplified signal is of a signal level within a dynamic range;
 incrementally increasing the gain coefficient determinative of the value of the amplified signal when the amplified signal is of a signal level beyond the dynamic range or when the signal level of the modified signal is of a value less than a predetermined level;
 decreasing the gain coefficient once the signal level of the modified signal is at least as great as the predetermined level; and
 calculating the signal level of the signal received by the receiver responsive to measurement of the signal level of the modified signal and of the coefficient value of the gain coefficient.

20. The method of claim 19 wherein values defining the dynamic range vary responsive to the coefficient value of the gain coefficient.

21. The method of claim 19 wherein the modified signal generated responsive to the amplified signal is delayed by a predetermined time period.

22. The method of claim 19 wherein said step of incrementally increasing the gain coefficient comprises varying a control voltage applied to control terminals of a variable amplifier which amplifies the signal received by the receiver.

23. The method of claim 22 wherein said step of generating the modified signal further comprises supplying the modified signal to processor circuitry.

24. The method of claim 23 wherein the processor circuitry generates a voltage signal forming the control voltage applied to the control terminals of the variable amplifier.

25. The method of claim 19 wherein the step of decreasing the gain coefficient comprises decreasing the control voltage applied to the control terminals of the variable amplifier which amplifies the signal received by the receiver.

26. The method of claim 19 wherein said step of calculating a value of the signal level comprises measuring the signal level of the modified signal which is of a value within the dynamic range of the modification circuitry, and then altering the signal level of the modified signal by a factor corresponding to the coefficient value of the amplification circuitry.

27. In a transceiver having receiver circuitry and transmitter circuitry, the combination with the receiver circuitry of:
 at least one variable amplifier having an adjustable gain coefficient for amplifying a signal received by the receiver circuitry to form thereby an amplified signal having a signal level of a value dependent upon a coefficient value of the gain coefficient;
 intermediate frequency demodulation circuitry having a dynamic range for receiving the amplified signal generated by the at least one variable amplifier and for generating a modified signal when the amplified signal is of a signal level within the dynamic range of the intermediate frequency demodulation circuitry, said modified signal generated thereby being delayed relative to the amplified signal received thereat by a delay period of a predetermined length;
 processor circuitry having an algorithm embodied therein for: (1) incrementally increasing the coefficient value of the gain coefficient of the at least one variable amplifier when the signal level of the amplified signal is beyond the dynamic range of the intermediate frequency demodulation circuitry or is of a value less than a predetermined level; (2) decreasing the coefficient value of the gain coefficient of the at least one variable amplifier once the signal level of the modified signal is at least as great as a predetermined level in an amount responsive to the length of the delay period; and (3) calculating the signal level of the signal received by the receiver circuitry responsive to measurement of the signal level of the modified signal and of the coefficient value of the gain coefficient of the at least one variable amplifier.

\* \* \* \* \*